United States Patent
Tanomura

(10) Patent No.: US 11,664,771 B2
(45) Date of Patent: May 30, 2023

(54) POWER AMPLIFIER

(71) Applicant: SUMITOMO ELECTRIC INDUSTRIES, LTD., Osaka (JP)

(72) Inventor: Masahiro Tanomura, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 319 days.

(21) Appl. No.: 17/215,145

(22) Filed: Mar. 29, 2021

(65) Prior Publication Data

US 2021/0367560 A1 Nov. 25, 2021

(30) Foreign Application Priority Data

May 21, 2020 (JP) .............................. JP2020-088920

(51) Int. Cl.
  *H03F 1/30* (2006.01)
  *H03F 3/21* (2006.01)

(52) U.S. Cl.
  CPC ................. *H03F 1/30* (2013.01); *H03F 3/21* (2013.01); *H03F 2200/447* (2013.01); *H03F 2200/451* (2013.01)

(58) Field of Classification Search
  CPC ................ H03F 1/30; H03F 3/20; H03G 3/30
  USPC ....................................... 330/296, 285, 302
  See application file for complete search history.

(56) References Cited

U.S. PATENT DOCUMENTS

| 6,064,268 | A | * | 5/2000 | Felps ........................ H03F 3/50 330/296 |
| 7,345,547 | B2 | * | 3/2008 | Wang ....................... H03F 3/605 330/296 |
| 7,518,449 | B2 | | 4/2009 | Iwasaki |
| 8,138,836 | B2 | * | 3/2012 | Matsuzuka ............. H03F 1/303 330/296 |
| 9,203,368 | B2 | | 12/2015 | Miyashita et al. |
| 2008/0143442 | A1 | * | 6/2008 | Hemmendorff ........... H03F 3/72 330/296 |

FOREIGN PATENT DOCUMENTS

| JP | 2008-078847 | 4/2008 |
| JP | 2015-041832 | 3/2015 |

* cited by examiner

*Primary Examiner* — Henry Choe
(74) *Attorney, Agent, or Firm* — IPUSA, PLLC

(57) ABSTRACT

A power amplifier includes a first transistor with a gate to which input power is applied and a drain from which output power is provided, a bias circuit configured to apply a bias to the gate of the first transistor, and a coupler configured to distribute the input power to the gate of the first transistor and to the bias circuit. The bias circuit includes a voltage generator circuit including a second transistor with a gate to which the power distributed to the bias circuit by the coupler is applied, the voltage generator circuit being configured to generate a first DC voltage increasing in accordance with an increase in the power distributed to the bias circuit. The bias circuit includes a level shifter circuit configured to generate a second DC voltage increasing in accordance with an increase in the first DC voltage.

5 Claims, 6 Drawing Sheets

POWER AMPLIFIER

CROSS-REFERENCE TO RELATED APPLICATION

This application claims priority under 35 U.S.C. § 119 to Japanese Patent Application No. 2020-088920, filed May 21, 2020, the contents of which are incorporated herein by reference in their entirety.

BACKGROUND

1. Field of the Invention

The present disclosure relates to a power amplifier.

2. Description of the Related Art

Cooling mechanisms has tended to become simplified in recent years, with the demand for a reduced size and low power consumption of backbone systems or the like. Power amplifiers provided in the systems are required to have good temperature dependence that makes changes in gain and an output voltage negligible even when temperature varies. For transistors included in such power amplifiers, mobility of carriers, such as electrons or holes, varies with changes in temperature, and the gain and output power also vary accordingly.

For the transistors described above, gain at low temperature is higher than gain at high temperature. In contrast, at low temperature, distortion performance P1 dB (output power when gain is reduced by 1 dB), which is one of performance factors for a power amplifier, is lower than distortion performance P1 dB at high temperature.

In this regard, a power amplifier capable of performing temperature compensation for gain and output power is disclosed. Such a power amplifier reduces deviation of small signal gain, a's well as mitigating temperature dependence of power gain corresponding to designated power. Specifically, the power amplifier has a cascaded first transistor and second transistor, an idle current control circuit connected to a gate of the first transistor, and a drain voltage control circuit connected to a gate of the second transistor. A radio frequency (RF) signal to be input to the power amplifier is applied to the gate of the first transistor. The idle current control circuit provides a positive temperature slope that causes an idle current flowing through the first transistor to be proportional to an ambient temperature. The drain control circuit provides a positive temperature slope that causes a drain voltage of the first transistor to be proportional to the ambient temperature (see, e.g., Patent document 1).

CITATION LIST

Patent Document

Patent document 1: Unexamined Japanese Patent Application No. 2015-41832
Patent document 2: Unexamined Japanese Patent Application No. 2008-78847

SUMMARY

According to one aspect of one or more embodiments, a power amplifier includes a first transistor with a gate to which input power is applied and a drain from which output power is provided, a bias circuit configured to apply a bias to the gate of the first transistor, and a coupler configured to distribute the input power to the gate of the first transistor and to the bias circuit. The bias circuit includes a voltage generator circuit including a second transistor with a gate to which the power distributed to the bias circuit by the coupler is applied, the voltage generator circuit being configured to generate a first DC voltage increasing in accordance with an increase in the power distributed to the bias circuit. The bias circuit includes a level shifter circuit configured to generate a second DC voltage increasing in accordance with an increase in the first DC voltage, the level shifter circuit being configured to apply the generated second DC voltage to the gate of the first transistor.

DESCRIPTION OF THE EMBODIMENTS

Figure 1:
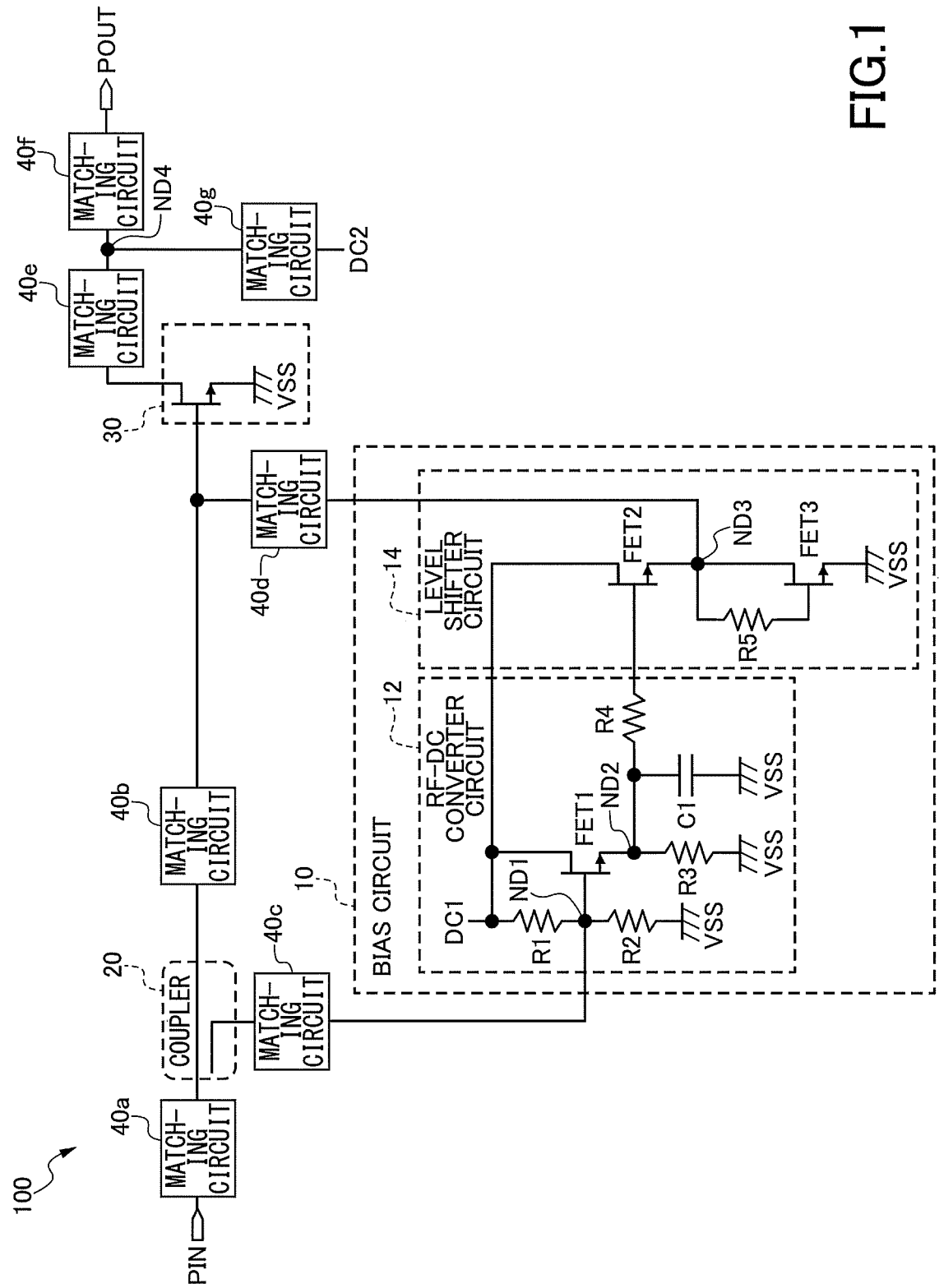
FIG. 1 is a circuit diagram illustrating an example of the configuration of a power amplifier according to a first embodiment.

Related art information relevant to the present disclosure recognized by the inventor of this application will be provided below.

The power amplifier including cascaded transistors described in Patent document 1 is configured using a metal oxide semiconductor (MOS) transistor with four terminals of a gate, a drain, a source, and a substrate terminal. By adjusting a substrate voltage to be applied to the substrate voltage, temperature compensation is performed.

When the power amplifier with the cascaded transistors is used, it is difficult to adopt a metal semiconductor (MES) transistor with three terminals of a gate, a drain, and a source, because the MES transistor does not include a substrate terminal. For example, the MES transistor is formed using a III-V semiconductor substrate. Note that for not only a power amplifier, but also a circuit that is designed using a device with four terminals and that desirably has characteristics determined based on an adjusted substrate voltage, it is difficult to adopt a device circuit with three terminals, instead of the device with the four terminals.

Moreover, for example, for a power amplifier using a III-V semiconductor substrate, when output power is high, a gate current flows and thus a voltage applied to a gate of a transistor is reduced due to a gate resistance or the like of the transistor. In general, power amplifiers using III-V semiconductors have good temperature dependence. However, it may be difficult to improve distortion performance P1 dB and output power.

In light of the issue described above, the present disclosure has an object to provide a power amplifier with excellent temperature dependence of gain and output power.

DESCRIPTION OF EMBODIMENTS OF THE PRESENT DISCLOSURE

One or more embodiments of the present disclosure will be outlined.

[1] A power amplifier according to one aspect of the present disclosure includes a first transistor with a gate to which input power is applied and a drain from which output power is provided, a bias circuit configured to apply a bias to the gate of the first transistor, and a coupler configured to distribute the input power to the gate of the first transistor and to the bias circuit. The bias circuit includes a voltage generator circuit including a second transistor with a gate to which the power distributed to the bias circuit by the coupler is applied, the voltage generator circuit being configured to generate a first DC voltage increasing in accordance with an increase in the power distributed to the bias circuit. The bias circuit includes a level shifter circuit configured to generate a second DC voltage increasing in accordance with an increase in the first DC voltage, the level shifter circuit being configured to apply the generated second DC voltage to the gate of the first transistor.

In the power amplifier, with the bias circuit to which power distributed by the coupler is applied, when the power amplifier is at high temperature, a higher gate voltage of the first transistor, due to a temperature rise, can be set in comparison to a case where the power amplifier is at low temperature. Thus, a higher drain current of the first transistor, due to the temperature rise, can be set. In other words, with the bias circuit, reduction in output power and gain due to a temperature rise of the power amplifier can be mitigated. As a result, a power amplifier with excellent temperature dependence of gain and output power can be provided.

[2] For [1] above, the second transistor includes a gate, a drain, and a source. The voltage generator circuit may include a first voltage line electrically connected to the drain of the second transistor, a ground line, and a first resistive element and a second resistive element electrically connected in series between the first voltage line and the ground line, a node between the first resistive element and the second resistive element being electrically connected to the gate of the second transistor. The voltage generator circuit may include a third resistive element electrically connected between the source of the second transistor and the ground line, and a capacitive element with a first end electrically connected to the source of the second transistor and a second end electrically connected to the ground line, a voltage at the first end of the capacitive element being the first DC voltage.

With such a configuration, a DC voltage divided based on a magnitude of a voltage associated with the first voltage line can be applied to a gate of the second transistor. For example, a threshold voltage for the second transistor that decreases with increasing temperature is used to enable a drain current of the second transistor to be increased. As a result, the capacitive element is charged in accordance with the drain current of the second transistor that varies depending on temperature, thereby enabling a first DC voltage to be produced.

[3] For [2] above, the level shifter circuit includes an input. The voltage generator circuit may include a fourth resistive element electrically connected between the first end of the capacitive element and the input of the level shifter circuit. With the fourth resistive element, RF power leakage from the second transistor and the level shifter circuit can be prevented. When input power is excessively applied, thermal runaway can be prevented from occurring in the first transistor.

[4] For [2] or [3] above, the voltage generator circuit includes an output terminal for providing the first DC voltage. The level shifter circuit includes a third transistor with a source, a drain electrically connected to the first voltage line, and a gate electrically connected to the output terminal of the voltage generator circuit. The level shifter circuit includes a fourth transistor electrically connected between the source of the third transistor and the ground line, the fourth transistor including a drain and a gate. The level shifter circuit includes a fifth resistive element electrically connected between the drain and the gate of the fourth transistor. The level shifter circuit may be configured to apply the second DC voltage associated with the source of the third transistor to the gate of the first transistor.

With such a configuration, a gate voltage of the third transistor that is connected to the output terminal of the voltage generator circuit can increase with increasing temperature. As a result, a drain current of the third transistor can increase in accordance with a first DC voltage that increases with increasing temperature. As a result, a drain current of the third transistor can be increased based on the gate voltage of the third transistor that increases with increasing temperature. In accordance with the increased drain current of the third transistor, a voltage associated with a connection node between the third transistor and the fourth transistor increases. Thus, a bias voltage to be applied from the bias circuit to the gate of the first transistor can increase with increasing temperature.

[5] For any one of [1] or [4] above, the power amplifier may further include a III-V semiconductor substrate on which the first transistor, the voltage generator circuit, and the level shifter circuit are mounted. In this case, the first transistor, as well as the second transistor, the third transistor, and the fourth transistor that are mounted on the voltage generator circuit, do not include a substrate terminal. In such a case, in the power amplifier with transistors that are formed on a III-V semiconductor substrate and that fail to have a substrate terminal, reduction in output power and gain due to a temperature rise of the power amplifier can be mitigated, thereby allowing for excellent temperature dependence.

DETAILS OF EMBODIMENTS OF THE PRESENT DISCLOSURE

Specific examples of a power amplifier of the present disclosure will be described below with reference to the drawings. In the following description, the same numbers are used to denote the same or corresponding elements, and description for those elements may be omitted. A given number among the numbers expressing an input terminal, an output terminal, a signal line, and nodes may be also used to refer to a signal, voltage, or current. Also, a given number among the numbers expressing power supply terminals (including a ground terminal) may be also used to refer to a power supply voltage or a power supply line.

First Embodiment

[Circuit Configuration of Power Amplifier]

FIG. 1 is a circuit diagram illustrating an example of the configuration of the power amplifier according to a first embodiment. For example, a power amplifier 100 illustrated in FIG. 1 is mounted on a compound semiconductor substrate such as a III-V semiconductor substrate. The power amplifier 100 includes a bias circuit 10, a coupler 20, a transistor 30 for power amplification, and multiple matching circuits 40 (40a, 40b, 40c, 40d, 40e, 40f, and 40g). The bias circuit 10 includes an RF-DC (direct current) converter circuit 12 and a level shifter circuit 14. The transistor 30 is an example of a first transistor, and the RF-DC converter circuit 12 is an example of a voltage generator circuit.

For example, the transistor 30 is an enhancement field effect transistor that is formed using a compound semiconductor substrate such as a III-V semiconductor substrate. With the enhancement transistor, a negative power source is not used, thereby enabling a system configuration including the power amplifier 100 to be simplified. Note that the transistor 30 may be a depletion field effect transistor.

An input terminal PIN to which input power is applied is connected to a gate of the transistor 30, via a matching circuit 40a, a coupler 20, and a matching circuit 40b. For example, the coupler 20 includes two transmission lines. One transmission line connects an output of the matching circuit 40a to an input of a matching circuit 40b, and another transmission line has a portion proximate to the one transmission line and is connected to an input of a matching circuit 40c. The coupler 20 has a function of outputting power that is to be delivered and that is a portion of input power, to the RF-DC converter circuit 12 via the matching circuit 40c. An output of the level shifter circuit 14 is connected to the gate of the transistor 30 via a matching circuit 40d.

A source of the transistor 30 is connected to a ground line VSS, and a drain of the transistor 30 is connected to an output terminal POUT of the power amplifier 100, and output power POUT is output from the output terminal POUT, via matching circuits 40e and 40f. A connection node ND4 at which an output of the matching circuit 40e and an input of the matching circuit 40f are connected is connected to a DC voltage line DC2 via a matching circuit 40g. Although not particularly restricted, the DC voltage line DC2 is supplied with a voltage of 2 V, for example.

The RF-DC converter circuit 12 of the bias circuit 10 includes resistors R1, R2, R3 and R4, a field effect transistor (FET) 1, and a capacitor C1. The level shifter circuit 14 includes field effect transistors FET 2 and FET 3 and a resistor R5. The transistor FET1 is an example of a second transistor, the transistor FET2 is an example of a third transistor, and the transistor FET3 is an example of a fourth transistor. The resistors R1, R2, R3, R4, and R5 are examples of a first resistive element, a second resistive element, a third resistive element, a fourth resistive element, and a fifth resistive element, respectively.

For example, as with the transistor 30, the transistors FET1, FET2, and FET3 are enhancement field effect transistors each formed using a compound semiconductor substrate such as a III-V semiconductor substrate. When the transistors FET1, FET2, and FET3 are the same type and kind as the transistor 30, e.g., an enhancement field effect transistor formed using a given compound semiconductor substrate, a common process of manufacturing a semiconductor is performed to enable the power amplifier 100 to be formed on one semiconductor substrate. Accordingly, a smaller chip size of the power amplifier 100 can be set in comparison to a case of using different types of transistors. Note that when the transistor 30 is a depletion transistor, the transistors FET1, FET2, and FET3 may be depletion transistors.

The sizes (total size of gate widths) of the transistors FET1, FET2, and FET3 are preferably smaller than the size of the transistor 30 (gate width) from the viewpoint of reducing power consumption of the bias circuit 10. The sizes (gate widths) of the transistors FET2 and FET3 are preferably the same, but may be different. Although not particularly restricted, for example, a gate width of the transistor 30 is set between 200 μm and 1200 μm, and preferably between 300 μm and 500 μm. A total gate width of the transistors FET1, FET2 and FET3 is set between 2 μm and 50 μm, and preferably 20 μm and 30 μm. Note that for example, channel lengths of the transistors 30, FET1, FET2, and FET3 are set to be the same value.

For example, the resistors R1, R2, R3, R4, and R5 are each formed using a metal interconnect or an epitaxial layer. For example, the capacitor C1 is a metal-insulator-metal (MIM) capacitor.

In the RF-DC converter circuit 12, the resistors R1 and R2 are connected in series between a DC voltage line DC1 and the ground line VSS, and the connection node ND1 is between the resistors R1 and R2. For example, a voltage associated with the DC voltage line DC1 is set between 1.6 V and 2.4 V. The DC voltage line is an example of a first voltage line. The resistors R1 and R2 serve to divide a voltage fed to the DC voltage line DC1. In such a case, a resistance of each of the resistors R1 and R2 is preferably increased from the viewpoint of reducing a current flowing through the resistors. However, the resistance of each of the resistors R1 and R2 is preferably decreased from the viewpoint of reducing a chip size. Although not particularly restricted, for example, the resistance of each of the resistors R1 and R2 is set between 200Ω and 1200Ω, and preferably between 400Ω and 700Ω.

The connection node ND1 at which the resistors R1 and R2 are connected together is connected to an output of the matching circuit 40c, and the gate of the transistor FET1 is connected to the output of the matching circuit 40c via the connection node ND1. A drain of the transistor FET1 is connected to the DC voltage line DC1. A source of the transistor FET1 is connected to the ground line VSS via the connection node ND2 and the resistor R3. A resistance of the resistor R3 is appropriately set based on a given size (e.g., a current that flows from the drain to the source and that varies with a given size) of the transistor FET1. In this example, the resistance of the resistor R3 is set between 500Ω and 12.5 kΩ, and preferably between 0.6 kΩ and 0.7 kΩ.

One end of the capacitor C1 is connected to the connection node ND2 (in this example, source of the transistor FET1), and another end is connected to the ground line VSS. The capacitor C1 is used for rectifying a voltage output from the transistor FET1. For example, capacitance of the capacitor C1 is set between 0.2 pF and 2 pF, and preferably between 0.2 pF and 0.3 pF. One end of the resistor R4 is connected to the source (connection node ND2) of the transistor FET1, and another end is connected to the gate of the transistor FET2 via an output terminal not illustrated of the RF-DC converter circuit 12.

Note that with the resistor R4, RF power leakage from the transistor FET1 to the transistor FET2 can be prevented. In such a manner, even when input power PIN is excessively applied, thermal runaway can be prevented from occurring in the transistor 30. From the viewpoint described above, a resistance of the resistor R4 is preferably high. However, the resistance is preferably low from the viewpoint of minimizing an increased circuit size of the power amplifier 100. Although not particularly restricted, in this example, the resistance of the resistor R4 is set between 100Ω and 1000Ω, and preferably between 400Ω and 600Ω.

In the level shifter circuit 14, the transistors FET2 and FET3 are connected in series between the DC voltage line DC1 and the ground line VSS. A connection node ND3 at which a source of the transistor FET2 and a drain of the transistor FET3 are connected is connected to the gate of the transistor FET3 via the resistor R5. The resistor R5 causes the transistor FET3 to operate as a diode.

Although not particularly restricted, a resistance of the resistor R5 is set between 100Ω and 1000Ω, and preferably between 400Ω and 600Ω. The connection node ND3 is connected to the gate of the transistor 30 via the matching circuit 40d. A second DC voltage (bias) set associated with the connection node ND3 is applied to the gate of the transistor 30.

[Operation of Power Amplifier]

Hereafter, the operation of the power amplifier 100 illustrated in FIG. 1 will be described. The operation of temperature compensation will be described first.

Figure 2:
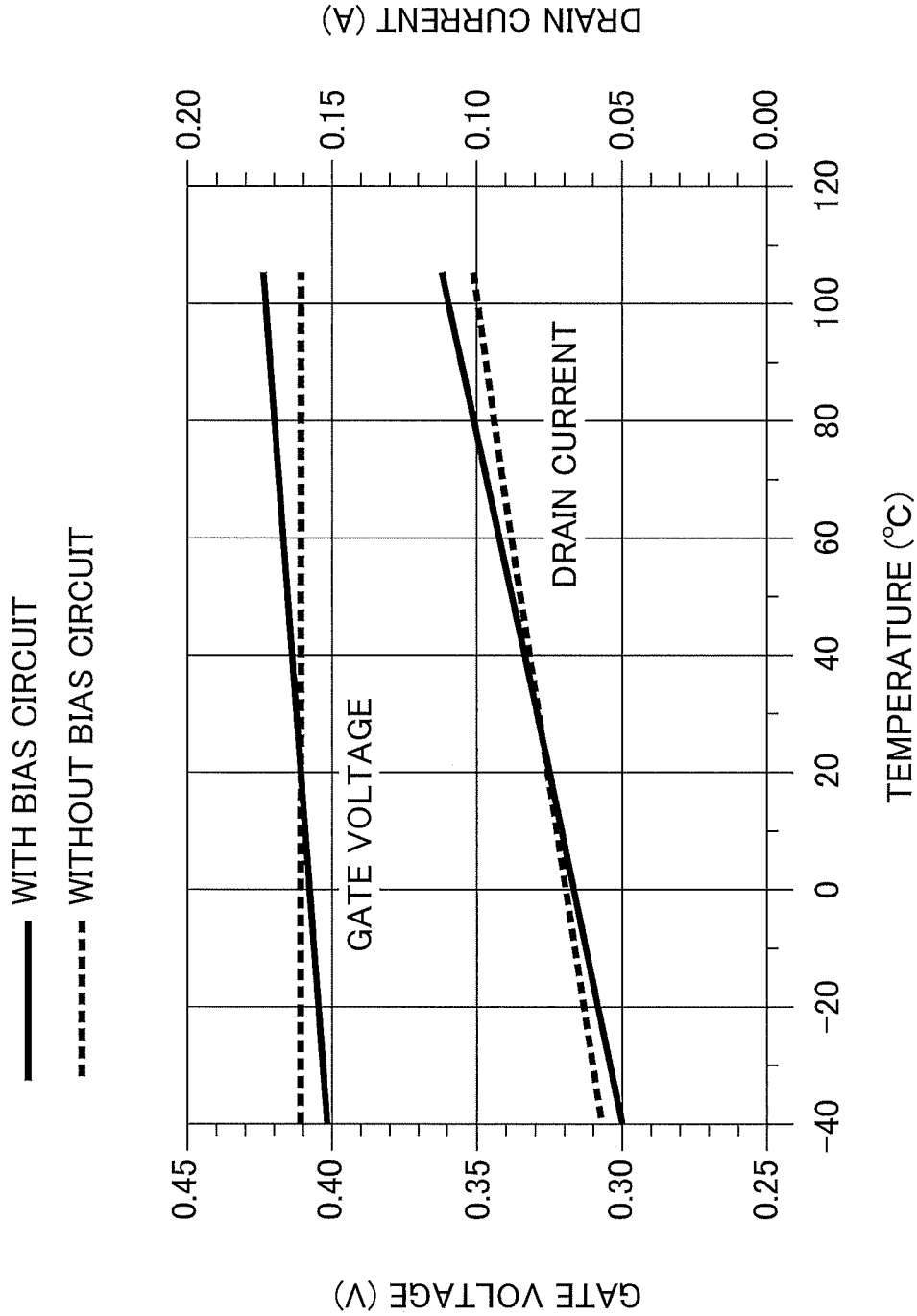
FIG. 2 is a diagram for describing an example of temperature characteristics of transistors for power amplification, with and without a bias circuit illustrated in FIG. 1.

FIG. 2 is a diagram for describing an example of temperature characteristics of transistors 30 for power amplification, with and without the bias circuit 10 illustrated in FIG. 1. In FIG. 2, the horizontal axis represents the temperature (° C.), and the vertical axis represents the gate voltage (V).

A threshold for a given transistor mounted on a III-V semiconductor substrate decreases with increasing temperature. A fixed DC voltage divided, by the resistors R1 and R2, from a DC voltage DC1 is applied to the gate of the transistor FET1. In such a case, as temperature increases, a threshold voltage for the transistor FET1 decreases, and thus a drain current of the transistor FET1 increases. In accordance with the increased drain current of the transistor FET1, a voltage drop across the resistor R3 increases and thus a voltage associated with the connection node ND2 increases. Thus, the capacitor C1 can be charged at the voltage associated with the connection node ND2, where the voltage increases depending on the increased temperature. Accordingly, the voltage at one end of the capacitor C1 toward the connection node ND2 is a first DC voltage that increases depending on the increased temperature.

Further, a gate voltage of the transistor FET2 that is connected to one end of the capacitor C1 via the resistor R4 can increase in accordance with the first DC voltage that increases with increased temperature. In such a manner, a drain current of the transistor FET2 can increase in accordance with the gate voltage of the transistor FET2 that increases with increasing temperature.

The increased drain current of the transistor FET2 can increase a drain-source voltage (e.g., voltage associated with the connection node ND3) of the diode-connected transistor FET3. As a result, a bias voltage to be applied, via the matching circuit 40d, from the bias circuit 10 to the gate of the transistor 30 for power amplification can increase with increasing temperature.

As described above, when the power amplifier 100 is at high temperature, the bias circuit 10 (FIG. 1), as illustrated in FIG. 2, has a function of providing a higher gate voltage of the transistor 30, due to a temperature rise, in comparison to the case where the power amplifier 100 is at low temperature. Further, when the power amplifier 100 is at high temperature, the bias circuit 10 has a function of providing a higher drain current of the transistor 30, due to a temperature rise, in comparison to the case where the power amplifier 100 is at low temperature.

In such a manner, the gain and the output power POUT of the power amplifier 100 can be each relatively increased at high temperature, while the gain and the output power POUT of the power amplifier 100 can be each relatively decreased at low temperature. In other words, the bias circuit 10 can perform temperature compensation, such that reduction in output power POUT and gain due to the temperature rise of the power amplifier 100 can be mitigated. As a result, the power amplifier 100 having little temperature dependence of gain and output power POUT can be provided.

In the present embodiment, the power amplifier 100 is formed using a compound semiconductor substrate such as a III-V semiconductor substrate, and each of the transistors 30, FET1, FET2, and FET3 does not have a substrate terminal. In such a power amplifier 100 with the transistors 30, FET1, FET2, and FET3 each of which does not have a substrate terminal, reduction in output power and gain due to the temperature rise of the power amplifier 100 can be mitigated, thereby enabling excellent temperature dependence to be provided.

Figure 3:
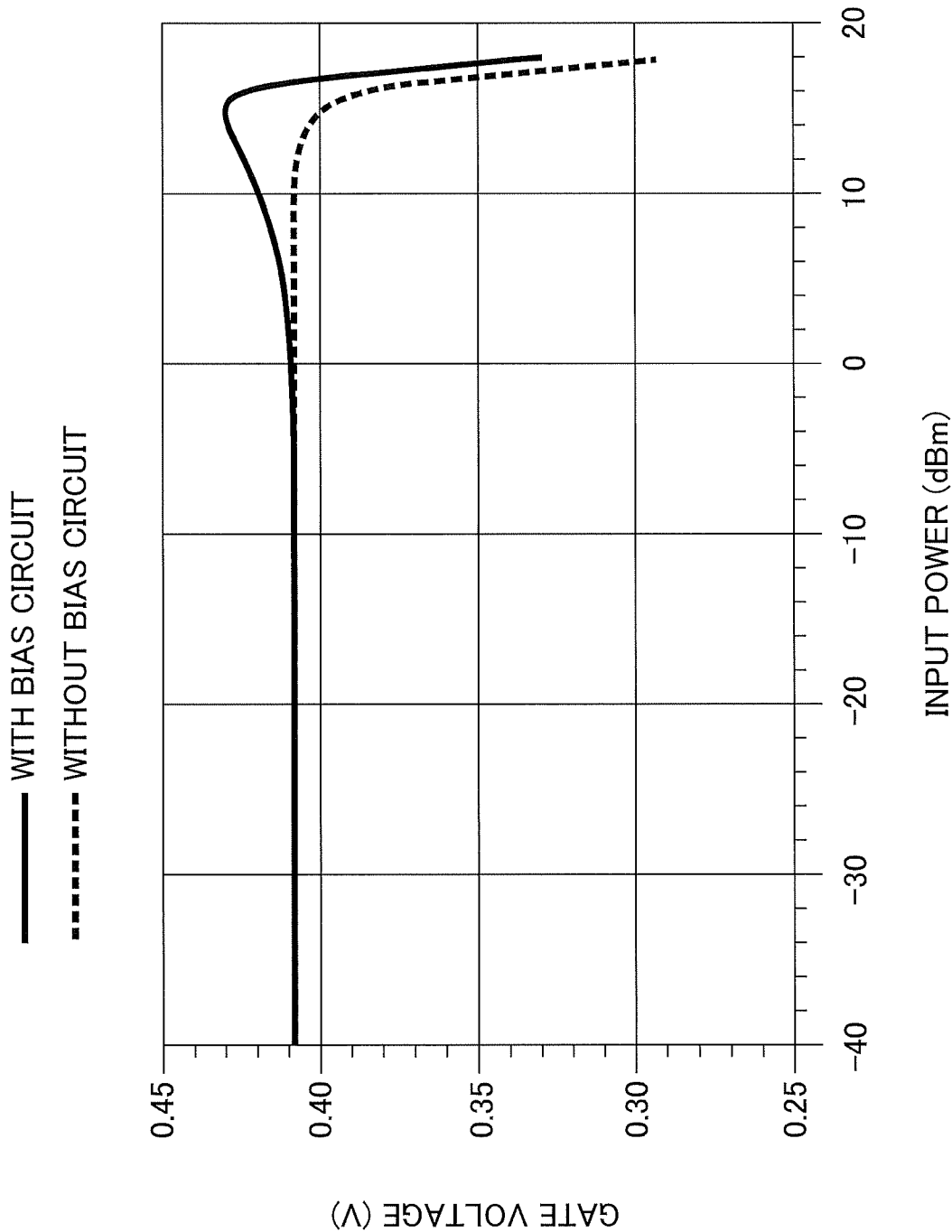
FIG. 3 is a diagram for describing an example of changes in a gate voltage of the transistor for power amplification due to variations in input power entering each of power amplifiers, with and without the bias circuit illustrated in FIG. 1.

FIG. 3 is a diagram for describing an example of changes in the voltage of the transistor 30 for power amplification due to variations in input power PIN entering each of the power amplifiers 100, with and without the bias circuit 10 illustrated in FIG. 1. In FIG. 3, the horizontal axis represents the input power (dBm), and the vertical axis represents the gate voltage (V). In the power amplifier 100 illustrated in FIG. 1, for example, when the input power PIN increases in a region where the input power PIN indicates 0.4 dBm or more, a drain current of the transistor FET1 increases due to rectification provided by the transistor FET1, the resistor R3, and the capacitor C1. In accordance with the increased drain current of the transistor FET1, a voltage drop across the resistor R3 increases and thus the gate voltage of the transistor FET2 increases.

In accordance with the increased gate voltage of the transistor FET2, the drain current of the transistor FET2 increases. Also, in accordance with the increased drain current of the transistor FET 2, a drain-source voltage of the diode-connected transistor FET 3 increases, and thus the voltage to be applied to the gate of the transistor 30 increases accordingly, as illustrated in FIG. 3.

As described above, in the power amplifier 100, when the input power PIN is high, the bias circuit 10 to which a portion of the input power PIN is applied via the coupler 20 has a function of applying a higher voltage to the gate of the transistor 30, in comparison to the case where the input power PIN is low. In such a manner, when the input power PIN becomes high and a rate of an increase in the output power POUT is reduced, the gate voltage of the transistor 30 can increase as illustrated in FIG. 3. As a result, the drain current of the transistor 30 can increase and thus gain reduction due to the increase in the input power PIN can be mitigated. Accordingly, distortion performance P1 dB can be improved.

[Effect of Bias Circuit]

Figure 4:
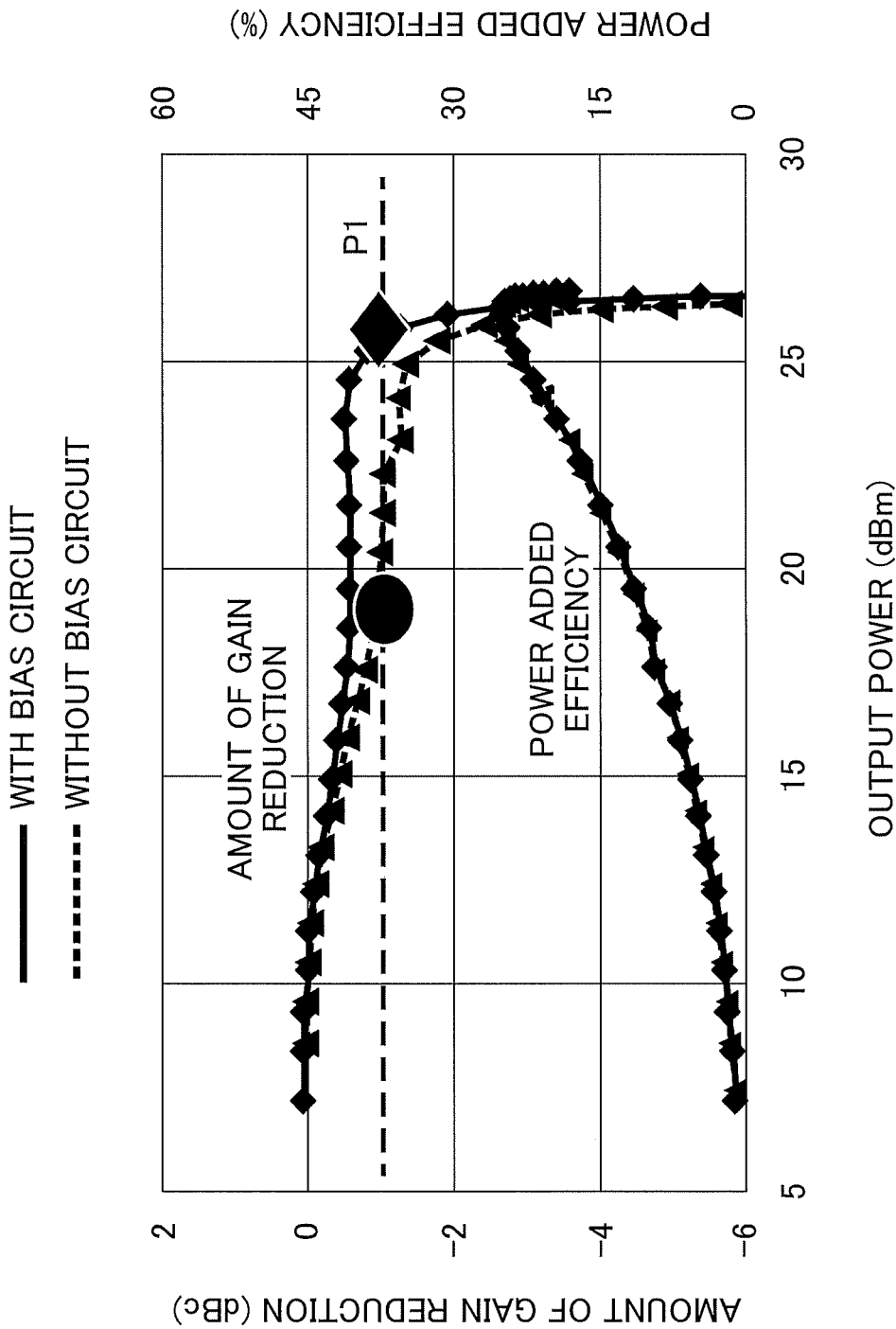
FIG. 4 is a diagram for describing an example of distortion performance P1 dB of each of the power amplifiers with and without the bias circuit illustrated in FIG. 1.

FIG. 4 is a diagram for describing an example of distortion performance P1 dB of each of the power amplifiers 100, with and without the bias circuit 10 in FIG. 1. In FIG. 4, the horizontal axis represents the output power (dBm), and the vertical axis represents the amount of gain reduction (dBc) or power added efficiency (%). For the power amplifier 100 in FIG. 1 with the bias circuit 10, distortion performance P1 dB can be improved by 5 dB or more (e.g., from 19 dBm to 26 dBm) in comparison to the case of the power amplifier 100 without the bias circuit 10.

Figure 5:
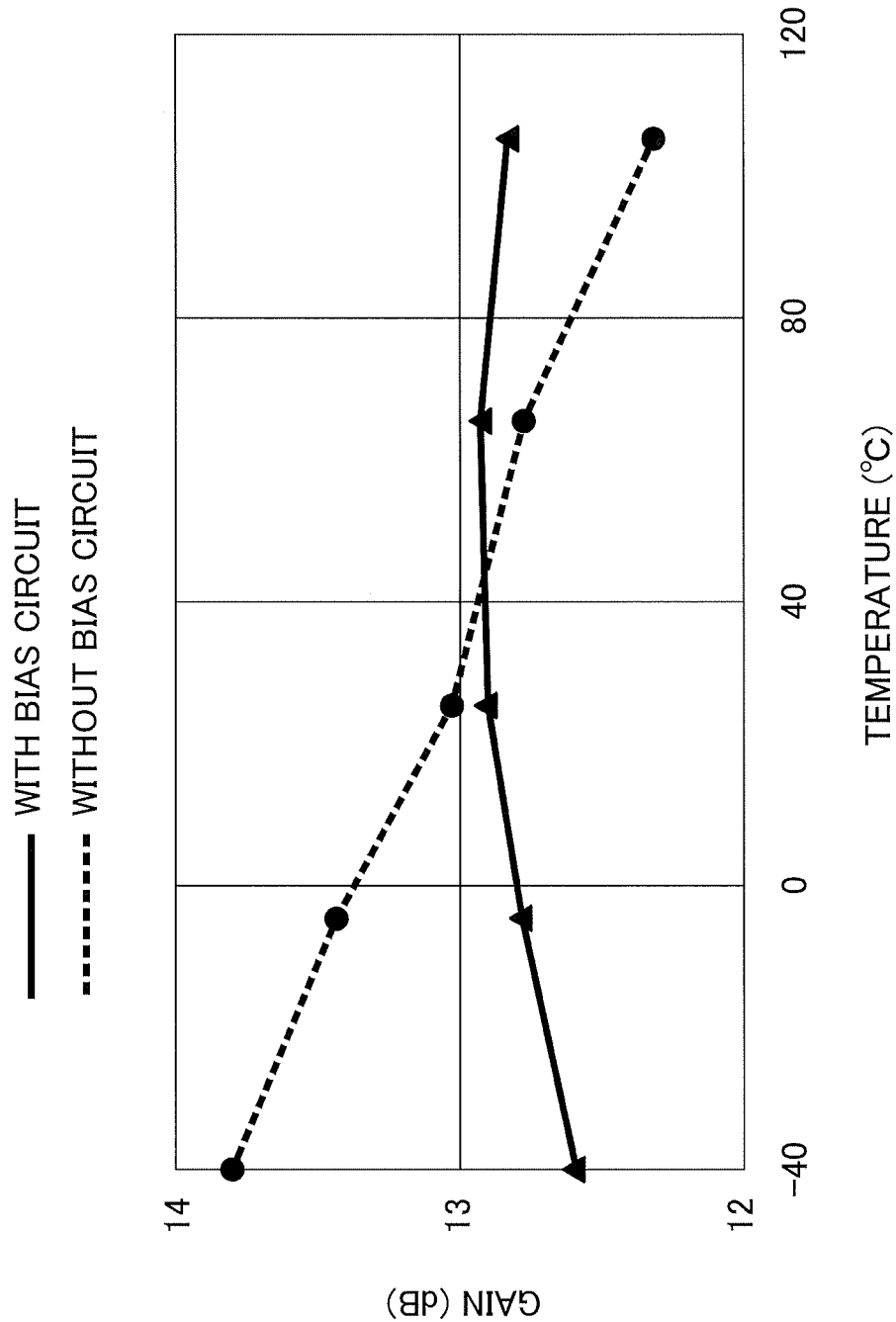
FIG. 5 is a diagram for describing an example of temperature dependence of gain of each of the power amplifiers with and without the bias circuit illustrated in FIG. 1.

FIG. 5 is a diagram for describing an example of temperature dependence of gain of each of the power amplifiers 100, with and without the bias circuit 10 in FIG. 1. In 5, the horizontal axis represents the temperature (° C.), and the vertical axis represents the gain (dB). For the power amplifier 100 in FIG. 1 with the bias circuit 10, a change amount of gain in the range of −40° C. to 105° C. can be improved by 1 dB or more, in comparison to the case of the power amplifier 100 without the bias circuit 10.

Figure 6:
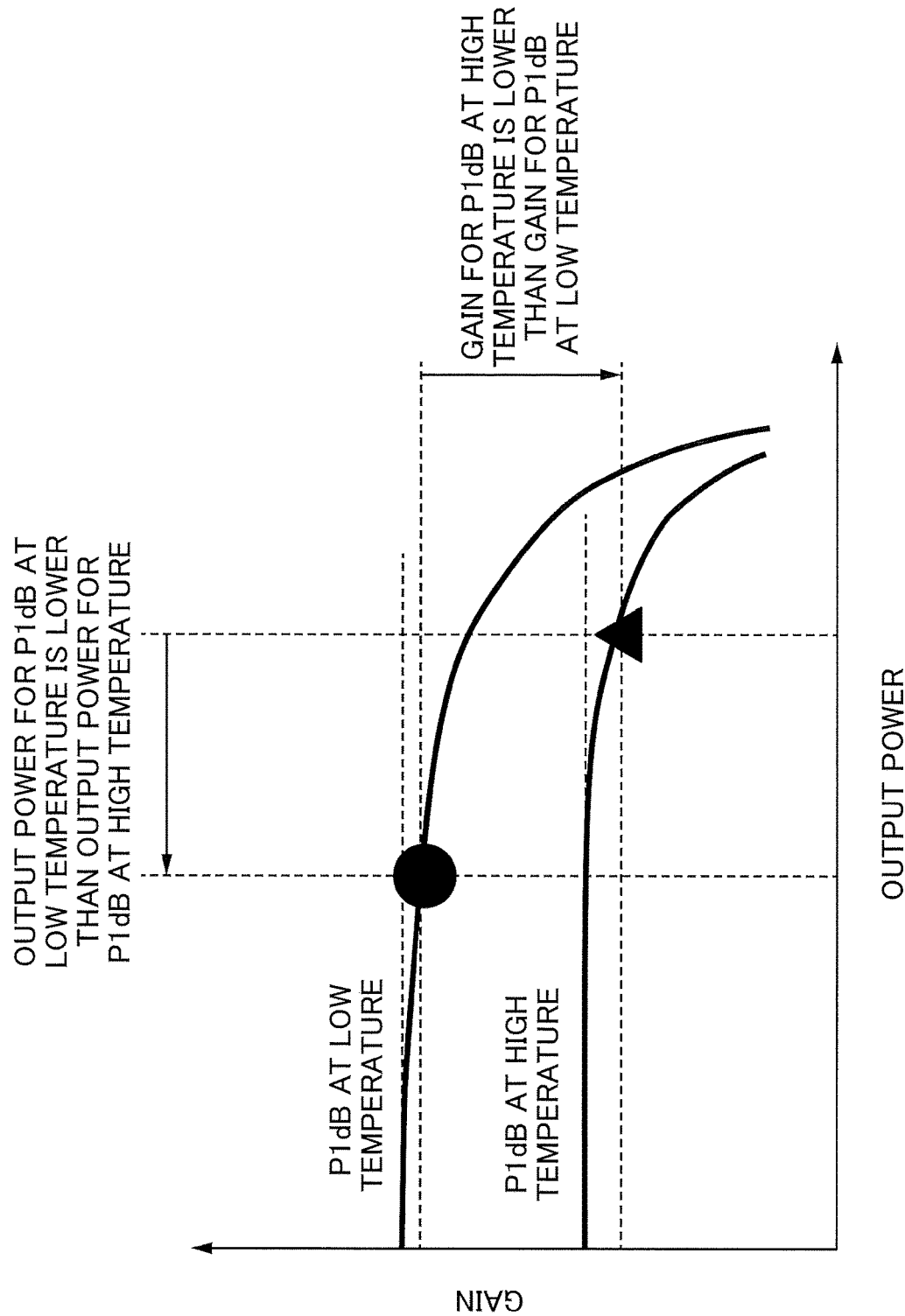
FIG. 6 is a diagram for describing an example of temperature dependence of output power and gain of a typical power amplifier.

FIG. 6 is a diagram for describing an example of temperature dependence of output power and gain of a typical power amplifier. In FIG. 6, the horizontal axis represents the output power, and the vertical axis represents the gain. For the typical power amplifier, one or more transistors included in the power amplifier have temperature characteristics, and thus gain at high temperature is lower than gain at low temperature and distortion performance P1 dB at low temperature is lower than distortion performance P1 dB at high temperature. In contrast, according to the present embodiment, as described above, the power amplifier 100 with less temperature dependence of gain and distortion performance P1 dB can be provided in comparison to the typical power amplifier.

The embodiments and the like of the present disclosure have been described. However, the present disclosure is not limited to the above-mentioned embodiments and the like. Various modifications, changes, substitutions, additions, deletions, or any combination of embodiments can be made within the scope set forth in the claims. These fall within a technical scope of the present disclosure.

What is claimed is:

1. A power amplifier comprising:
    a first transistor with a gate to which input power is applied and a drain from which output power is provided;
    a bias circuit configured to apply a bias to the gate of the first transistor; and
    a coupler configured to distribute the input power to the gate of the first transistor and to the bias circuit,
    wherein the bias circuit includes:
        a voltage generator circuit including a second transistor with a gate to which the power distributed to the bias circuit by the coupler is applied, the voltage generator circuit being configured to generate a first DC voltage increasing in accordance with an increase in the power distributed to the bias circuit; and
        a level shifter circuit configured to generate a second DC voltage increasing in accordance with an increase in the first DC voltage, the level shifter circuit being configured to apply the generated second DC voltage to the gate of the first transistor.

2. The power amplifier according to claim 1, wherein the second transistor includes a gate, a drain, and a source, and
    wherein the voltage generator circuit includes:
        a first voltage line electrically connected to the drain of the second transistor;
        a ground line;
        a first resistive element and a second resistive element electrically connected in series between the first voltage line and the ground line, a node between the first resistive element and the second resistive element being electrically connected to the gate of the second transistor;
        a third resistive element electrically connected between the source of the second transistor and the ground line; and
        a capacitive element with a first end electrically connected to the source of the second transistor and a second end electrically connected to the ground line, a voltage at the first end of the capacitive element being the first DC voltage.

3. The power amplifier according to claim 2, wherein the level shifter circuit includes an input, and
    wherein the voltage generator circuit includes a fourth resistive element electrically connected between the first end of the capacitive element and the input of the level shifter circuit.

4. The power amplifier according to claim 2, wherein the voltage generator circuit includes an output terminal for providing the first DC voltage,
    wherein the level shifter circuit includes:
        a third transistor with a source, a drain electrically connected to the first voltage line, and a gate electrically connected to the output terminal of the voltage generator circuit;
        a fourth transistor electrically connected between the source of the third transistor and the ground line, the fourth transistor including a drain and a gate; and
        a fifth resistive element electrically connected between the drain and the gate of the fourth transistor, and
    wherein the level shifter circuit is configured to apply the second DC voltage associated with the source of the third transistor to the gate of the first transistor.

5. The power amplifier according to claim 1, further comprising a III-V semiconductor substrate on which the first transistor, the voltage generator circuit, and the level shifter circuit are mounted.

* * * * *